(12) United States Patent
Nishide

(10) Patent No.: US 6,211,784 B1
(45) Date of Patent: *Apr. 3, 2001

(54) OBJECT DETECTOR AND OBJECT DETECTOR SYSTEM

(75) Inventor: Mitsuo Nishide, Osaka (JP)

(73) Assignee: Keyence Corporation, Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/820,676

(22) Filed: Mar. 18, 1997

(30) Foreign Application Priority Data

Mar. 18, 1996 (JP) .................................................. 8-60864

(51) Int. Cl.$^7$ .................................................. G08B 13/04
(52) U.S. Cl. ...................... 340/568.1; 340/436; 340/903; 340/815.53
(58) Field of Search .................................... 340/568, 435, 340/436, 901, 903, 904, 815.45, 815.53, 815.56, 815.65; 367/907; 342/70, 71; 180/167, 168, 169 K, 170; 364/460, 461, 426.04; 345/160, 102

(56) References Cited

U.S. PATENT DOCUMENTS

| | | | |
|---|---|---|---|
| 4,383,238 | * | 5/1983 | Endo .................................... 340/435 |
| 4,603,329 | | 7/1986 | Bangerter et al. .................... 340/679 |
| 4,632,543 | * | 12/1986 | Endo .................................... 340/435 |
| 4,634,272 | * | 1/1987 | Endo .................................... 340/435 |
| 4,644,341 | * | 2/1987 | Warner ................................ 340/435 |
| 4,766,421 | * | 8/1988 | Beggs et al. ......................... 340/435 |
| 4,990,895 | * | 2/1991 | Juds .................................... 340/435 |
| 4,996,415 | * | 2/1991 | Tanaka et al. ........................ 340/435 |
| 5,039,217 | * | 8/1991 | Mackawa et al. .................... 340/435 |
| 5,042,015 | * | 8/1991 | Stringer .............................. 340/435 |
| 5,117,301 | * | 5/1992 | Tsumura .............................. 340/435 |
| 5,298,905 | * | 3/1994 | Dahl .................................... 340/435 |
| 5,347,117 | | 9/1994 | Fooks et al. . |
| 5,489,149 | * | 2/1996 | Akasu ................................ 340/435 |
| 5,589,939 | * | 12/1996 | Kitajima .............................. 340/435 |
| 5,633,705 | * | 5/1997 | Asayama ............................ 340/435 |
| 5,661,551 | * | 8/1997 | Yamabuchi ........................ 340/435 |
| 5,710,565 | * | 1/1998 | Shirai et al. .......................... 342/70 |

FOREIGN PATENT DOCUMENTS

| | | | |
|---|---|---|---|
| 88 03 005 | 9/1988 | (DE) | ................ G01S/7/00 |
| 38 04 073 | 8/1989 | (DE) | ................ G01S/13/94 |
| 0 342 835 | 11/1989 | (EP) | ................ G09G/3/36 |
| 0 605 252 | 7/1994 | (EP) | ................ G01S/17/02 |
| 59-161740 | 10/1984 | (JP) | ................ H03K/17/78 |
| 59-161741 | 10/1984 | (JP) | ................ H03K/17/78 |
| 60-68726 | 5/1985 | (JP) | ................ H03K/17/78 |
| 62-146010 | 6/1987 | (JP) . | |
| 3-113535 | 11/1991 | (JP) . | |
| 3-128333 | 12/1991 | (JP) . | |
| 4-898 | 1/1992 | (JP) . | |
| 4-360415 | 12/1992 | (JP) | ................ H03K/17/78 |
| 5-7145 | 1/1993 | (JP) . | |
| 5-136677 | 6/1993 | (JP) | ................ H03K/17/78 |
| 8-114463 | 5/1996 | (JP) . | |

OTHER PUBLICATIONS

Burkhard Dullo: "Optischer Distanzsensor Auf Basis Der Lichtlaufzeitmessung" Messen und prufen, vol. 27, No. 9, Sep. 1, 1991; pp. 398–400.

* cited by examiner

*Primary Examiner*—Nina Tong
(74) *Attorney, Agent, or Firm*—Sughrue, Mion, Zinn, Macpeak & Seas, PLLC

(57) ABSTRACT

An object detector including a detector, a setting device, a comparator and a display. The detector outputs a detected quantity based on a presence or absence of an object to be detected. The setting device sets a threshold, The comparator compares the detected quantity obtained by the detector with the threshold set by the setting device and outputs a detected result. The display numerically displays either the detected quantity obtained by the detector or the threshold set by the setting device.

27 Claims, 6 Drawing Sheets

OBJECT DETECTOR AND OBJECT DETECTOR SYSTEM

BACKGROUND OF THE INVENTION

The present invention relates to an object detector, an object detector system, a display device for object detectors, and a setting device for object detectors.

Object detectors such as photoelectric switches, proximity switches, ultrasonic switches have heretofore been used for detecting the presence or absence of a moving object along production lines in plants (or factories). For example, a photoelectric switch determines the presence or absence of an object by projecting light onto the conveying path of an object and detecting the presence or absence of reflected light or transmitted light from the object.

In a photoelectric switch of a transmitting type, in the case where there is no object to be detected in a sensing region, light emitted from the light-emitting section is received by the light-receiving section. In this case, when the level of light received is equal to or smaller than a predetermined threshold, it is judged that the object is present. On the other hand, in a photoelectric switch of a reflecting type, in the case where there is an object to be detected in the sensing region, light emitted from the emitting section is reflected by the object, and the reflected light is received by the light-receiving section. In this case, when the level of light received exceeds a predetermined threshold, it is judged that the object is present. The sensitivity of the photoelectric switch is adjusted by changing the aforementioned threshold (operative level).

The thus operating photoelectric switches may, in some cases, face the problem that the level of light received is reduced due to such causes as displaced optical axis, stained light-emitting or light-receiving surfaces, or deteriorated performance of the light-emitting element of the light-emitting section. In these cases, it is necessary to re-set the sensitivity by changing the threshold of the photoelectric switch.

To overcome this problem, photoelectric switches of an automatic sensitivity setting type which can set the sensitivity automatically are being developed. Automatic sensitivity setting photoelectric switches sample received light quantities by a control input from an external device and set a threshold based on groups of data obtained by causing a microcomputer or the like to calculate the sampled data.

In the aforementioned automatic sensitivity setting type photoelectric switch, a threshold is automatically set within the photoelectric switch so that the sensitivity of the photoelectric switch becomes proper. However, the operator is not informed of a set threshold, nor can he finely adjust the set threshold so as to match a measuring environment.

On the other hand, some conventional photoelectric switches display the level of light received by using a plurality of light-emitting diodes (LED). However, the operator is not informed of a correct quantity of light received, nor can he be informed of a currently set threshold. Thus, a margin of the quantity of light received with respect to the currently set threshold cannot be recognized. As a result, the operator cannot know the timing at which to re-set the sensitivity, either.

Moreover, in a photoelectric switch system having a plurality of photoelectric switches, a respective threshold must be set for each photoelectric switch. In an automatic sensitivity setting type photoelectric switch system in particular, each photoelectric switch has a threshold automatically set. In this case, the operator is not informed of a threshold set for each photoelectric switch, nor can he be informed of the level of light received of each photoelectric switch correctly, either. Further, he cannot make a fine adjustment of the threshold set for each photoelectric switch so as to match a measuring environment, either.

An object of the present invention is to provide an object detector system including an object detector that allows the operator to be informed of a set threshold or a detected quantity correctly.

Another object of the present invention is to provide an object detector system including an object detector that allows the operator to finely adjust a set threshold.

Still another object of the present invention is to provide a display device for object detectors that can display the threshold or detected quantity of an object detector correctly.

Still another object of the present invention is to provide a setting device for object detectors that can finely adjust the threshold of an object detector.

SUMMARY OF THE INVENTION

An object detector according to a first aspect of the invention includes: detecting means for outputting a detected quantity based on the presence or absence of an object to be detected; setting means for setting a threshold; a comparing means for comparing the detected quantity obtained by the detecting means with the threshold set by the setting means and outputting a detected result; and display means for numerically displaying either the detected quantity obtained by the detecting means or the threshold set by the setting means.

An object detector according to a second aspect of the invention further includes adjusting means for adjusting the threshold set by the setting means in the construction of the object detector according to the first aspect of the invention.

According to a third aspect of the invention, in the object detector according to the first and the second aspects of the invention, the setting means further includes automatic setting means for determining, at a setting operation, the threshold based on a detected quantity of the presence of the object and a detected quantity of the absence of the object.

In the object detectors according to the first, the second, and the third aspects of the invention, not only the detected result is outputted by comparing the detected quantity obtained by the detecting means with the threshold set by the setting means, but also the detected quantity obtained by the detecting means or the threshold set by the setting means is numerically displayed. Therefore, the operator is informed of the detected quantity or the set threshold correctly.

In the object detector according to the second aspect, of the invention in particular, the threshold set by the setting means can be adjusted by the adjusting means. Therefore, the operator can finely adjust the preset threshold so as to match a measuring environment.

Further, in the object detector according to the third aspect of the invention, the setting means includes the automatically setting means. Therefore, the threshold is automatically set based on detected quantities to be obtained by the detecting means at the time a setting operation is performed, the detected quantities being obtained at the time a detecting operation is performed and at the time a detecting operation is not performed. In this case, the automatically set threshold is numerically displayed. Hence, the operator is informed of the automatically set threshold correctly.

An object detector according to a fourth aspect of the invention includes: detecting means for outputting a detected quantity based on the presence or absence of an object to be detected; setting means for setting a threshold; comparing means for comparing the detected quantity obtained by the detecting means with the threshold set by the setting means and outputting a detected result; and display means for numerically displaying a detection ratio of the detected quantity obtained by the detecting means with respect to the threshold set by the setting means.

In the object detector according to the fourth aspect of the invention, not only the detected result is outputted by comparing the detected quantity obtained by the detecting means with the threshold set by the setting means, but also the detection ratio of the detected quantity obtained by the detecting means with respect to the threshold set by the setting means is numerically displayed. Therefore, the operator can recognize a margin of the detected quantity with respect to the set threshold. As a result, the operator can know the timing at which to re-set the threshold easily.

An object detector according to a fifth aspect of the invention includes: detecting means for outputting a detected quantity based on the presence or absence of an object to be detected; setting means for setting, at a setting operation, a threshold based on a detected quantity of the presence of the object and a detected quantity of the absence of the objects; comparing means for comparing the detected quantity obtained by the detecting means with the threshold set by the setting means and outputting a detected result; and adjusting means for adjusting the threshold set by the setting means.

In the object detector according to the fifth aspect of the invention, the detected result is outputted by comparing the detected quantity obtained by the detecting means with the threshold set by the setting means. In addition, the threshold set by the setting means can be adjusted by the adjusting means. Therefore, the operator can finely adjust the set threshold so as to match a measuring environment.

An object detector system according to a sixth aspect. of the invention includes a master object detector and a slave object detector. Each of the master object detector and the slave object detector includes: detecting means for outputting a detected quantity based on the presence or absence of an object to be detected; setting means for setting a threshold; comparing means for comparing the detected quantity obtained by the detecting means with the threshold set by the setting means and outputting a detected result. The master object detector further includes: display means for numerically displaying the detected quantity obtained by the detecting means of the master object detector, the detected quantity obtained by the detecting means of the slave object detector, the threshold set by the setting means of the master object detector, or the threshold set by the setting means of the slave object detector.

In the object detector system according to the sixth aspect of the invention, each of the master object detector and the slave object detector outputs a detected result by comparing the detected quantity obtained by the detecting means with the threshold set by the setting means. The master object detector in particular numerically displays the detected quantity obtained by the detecting means of the master object detector, the detected quantity obtained by the detecting means of the slave object detector, the threshold set by the setting means of the master object detector, or the threshold set by the setting means of the slave object detector. Therefore, the operator is informed of the detected quantity obtained by the master object detector or the slave object detector or the threshold set to the master object detector or the slave object detector correctly.

An object detector system according to a seventh aspect of the invention includes a master object detector and a slave object detector. Each of the master object detector and the slave object detector includes: detecting means for outputting a detected quantity based on the presence or absence of an object to be detected; setting means for setting a threshold; comparing means for comparing the detected quantity obtained by the detecting means with the threshold set by the setting means and outputting a detected result. At least either one of the master object detector or the slave object detector further includes: adjusting means for adjusting the threshold set by the setting means of the master object detector or slave object detector or the threshold set by the setting means of the other slave object detector or master object detector.

In the object detector system according to the seventh aspect of the invention, each of the master object detector and the slave object detector outputs a detected result by comparing the detected quantity obtained by the detecting means with the threshold set by the setting means. Especially, at least one of the master object detector or the slave object detector has adjusting means. Therefore, the threshold set by the setting means of the master object detector or slave object detector concerned or the threshold set by the setting means of the other slave object detector or master object detector can be adjusted. Hence, the operator can finely adjust the thresholds respectively set by the master object detector and the slave object detector so as to match a measuring environment.

According to an eighth aspect of the invention, in the construction of the object detector system according to the sixth or the seventh aspect of the invention, the setting means further includes automatic setting means for setting, at a setting operation, a threshold based on a detected quantity of the presence of the object and a detected quantity of the absence of the object.

In the object detector system according to the eighth aspect of the invention, the setting means includes automatic setting means. Therefore, at a setting operation, the threshold is automatically set based on a detected quantity obtained at the time a detecting operation is performed and a detected quantity obtained at the time a detecting operation is not performed. Hence, the operator is informed of the automatically set threshold correctly or can finely adjust the automatically set threshold so as to match a measuring environment.

A display device for object detectors according to a ninth aspect of the invention is a display device that is to be connected to an object detector, and includes: communicating means for communicating with the object detector; and display means for numerically displaying a detected quantity obtained by the object detector based on data communicated by the communicating means or a threshold set by the object detector.

In the display device for object detectors according to the ninth aspect of the invention, the detected quantity obtained by the object detector or the threshold set by the object detector is numerically displayed. Therefore, the operator is informed of the detected quantity or the threshold of the object detector correctly.

A setting device for object detectors according to a tenth aspect of the invention is a setting device that is to be connected to an object detector, and includes: communicating means for communicating with the object detector; and adjusting means for adjusting a threshold set by the object detector through the communicating means.

In the setting device for object detectors according to the tenth aspect of the invention, the threshold set to the object detector can be adjusted by the adjusting means. Therefore, the operator can finely adjust the threshold of the object detector so as to match a measuring environment.

DETAILED DESCRIPTION OF THE PREFERRED EMBODIMENTS

Figure 1:
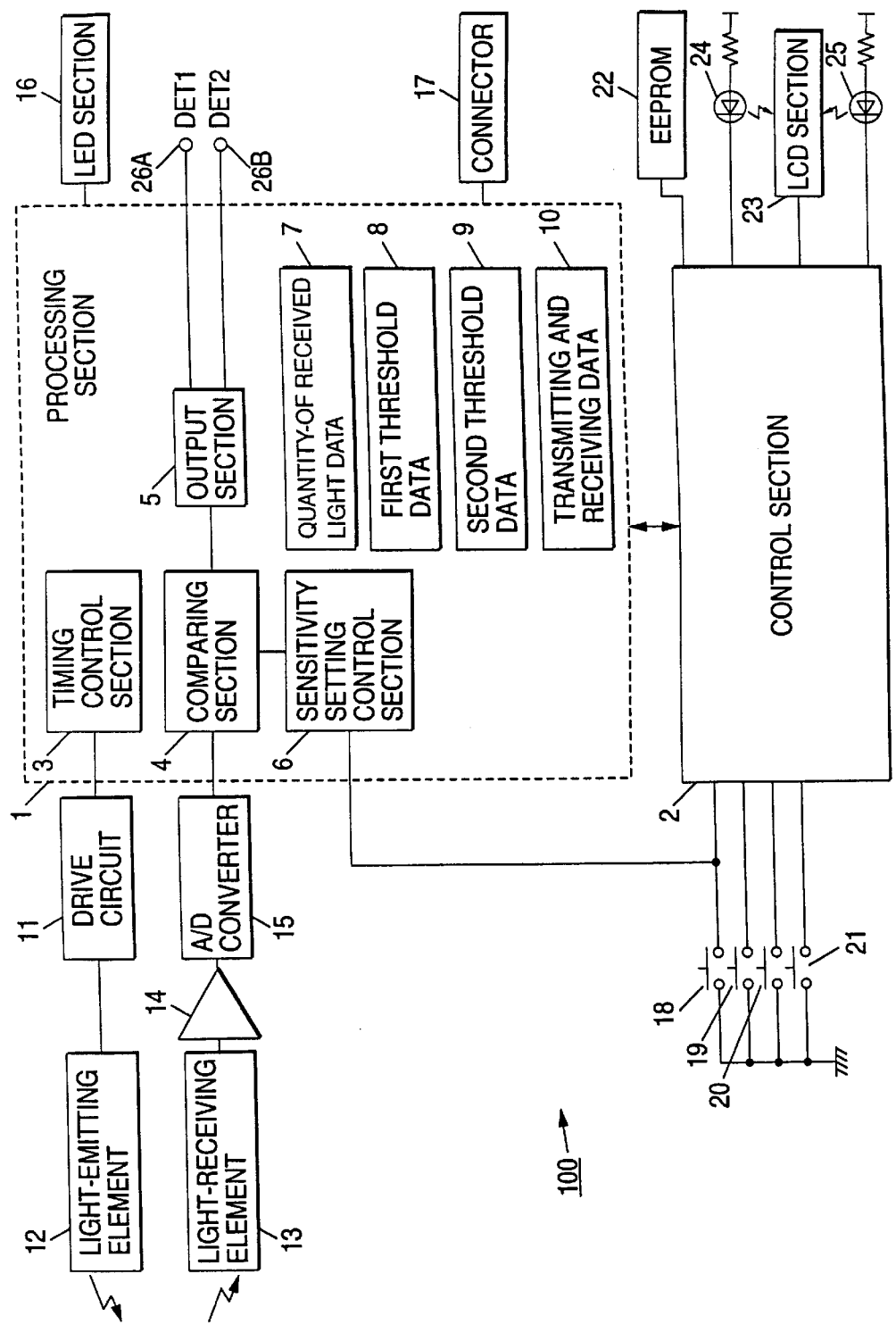
FIG. 1 is a block diagram showing a configuration of a master photoelectric switch in an embodiment of the present invention.
Figure 2:
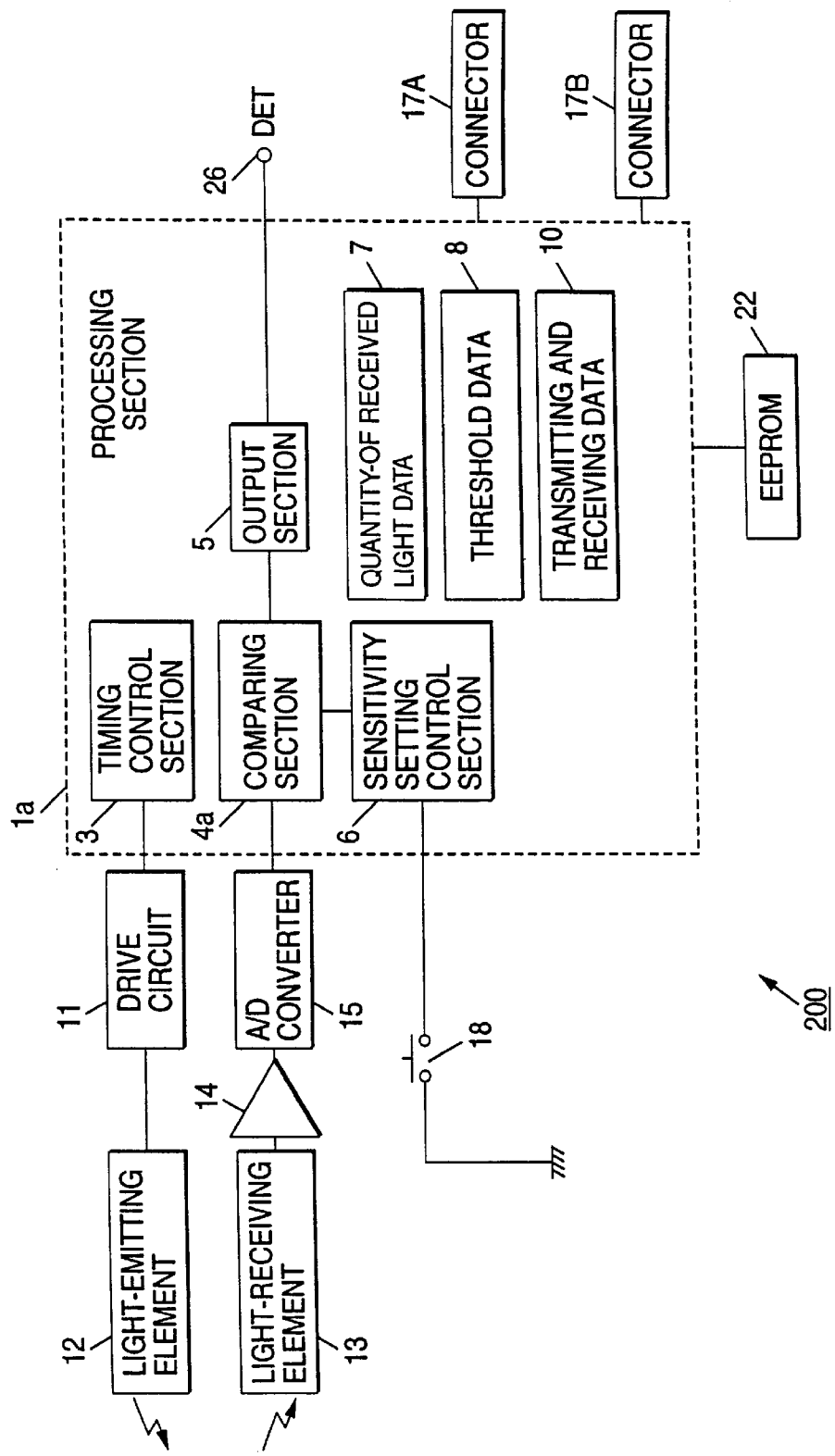
FIG. 2 is a block diagram showing a configuration of a slave photoelectric switch in the embodiment.

FIG. 1 is a block diagram showing a configuration of a master photoelectric switch in an embodiment of the present invention. Further, FIG. 2 is a block diagram showing a configuration of a slave photoelectric switch in the embodiment.

A master photoelectric switch 100 shown in FIG. 1 has a processing section 1 constructed of a gate array and a control section 2 constructed of a CPU (central processing unit). The processing section 1 includes a timing control section 3, a comparing section 4, an output section 5, a sensitivity setting control section 6, a quantity-of-received-light data register 7, a first threshold data register 8, a second threshold data register 9, and a transmitting and receiving register 10.

The processing section 1 has a drive circuit 11, a light-emitting element 12, a light-receiving element 13, an amplifier 14, and an A/D converter (analog-to-digital converter) 15 connected thereto. Respective sensor heads head sections (not shown) are connected to the light-emitting element 12 and the light-receiving element 13 through optical fibers.

The timing control section 3 controls light-emitting timing of the light-emitting element 12 through the drive circuit 11. When the drive circuit 11 drives the light-emitting element 12, light is projected onto a sensing region through an optical fiber (not shown) from the light-emitting element 12. In the case where the sensor head section is of a transmitting type, when no object is present in the sensing region, the light emitted from the light-emitting element 12 is received by the light-receiving element 13. On the other hand, in the case where the sensor head section is of a, reflecting type, when an object is present in the sensing region, the reflected light from the object is received by the light-receiving element 13.

An output signal from the light-receiving element 13 is amplified by the amplifier 14, and the amplified signal is thereafter delivered to the A/D converter 15. The A/D converter 15 converts the output signal from the amplifier 14 to a digital signal, and the digital signal is given to the processing section 1 as quantity-of-received-light data. The quantity-of-received-light data is stored in the register 7 in the processing section 1.

The sensitivity setting control section 6 performs a sensitivity setting operation by means of a predetermined method at the time of setting a sensitivity, and automatically sets a threshold. For example, the sensitivity setting control section 6 sets a threshold based on a maximum and a minimum of the quantity-of-received-light data; i.e., the sensitivity setting control section 6 sets a threshold between such maximum and minimum. The master photoelectric switch 100 according to the present embodiment stores two pieces of threshold data obtained by two iterations of the sensitivity setting operation in the registers 8, 9 as a first piece of threshold data and a second piece of threshold, data, respectively. The transmitting and receiving register. 10 temporarily stores data to be transmitted to and received from either the control section 2 or a slave photoelectric switch 200 shown in FIG. 2.

The comparing section 4 compares the quantity-of-received-light data with the first piece of threshold data and the quantity-of-received-light data with the second piece of threshold data on a time sharing basis, and applies the compared results to output terminals 26A, 26B through the output section 5 as a first detected signal DET1 and a second detected signal DET2, respectively. The master photoelectric switch 100 has two channels "A", "B" corresponding to the first piece of threshold data and the second piece of threshold data, respectively. Further, slave photoelectric switches 200 sequentially connected to the master photoelectric switch 100 are sequentially given channels "1", "2", . . . .

Further, the processing section 1 is connected to an LED section 16 which displays the detected results and the sensitivity conditions in the channels "lA", "B". The processing section 1 is also has a connector 17 which serves to connect the slave photoelectric switch 200 shown in FIG. 2.

On the other hand, the control section 2 has a sensitivity setting switch 18, an up switch 19, a down switch 20, and a mode switch 21 connected thereto. The sensitivity switch 18 is used to give a sensitivity-setting command to the sensitivity setting control section 6 of the processing section 1. Further, the up switch 19 and the down switch 20 are used to finely adjust a threshold set by the sensitivity setting control section 6. The mode switch 21 is mainly used to switch display modes that will be described later.

Further, the control section 2 has an EEPROM (electrically erasable and writable read only memory) 22 connected thereto. The EEPROM 22 stores the first piece of threshold data, second piece of threshold data, and channels of the master photoelectric switch 100. Furthermore, the control section 2 has an LCD section (liquid crystal display section) 23 connected thereto. The LCD section 23 gives a digital numerical display of the first piece of threshold data, second piece of threshold data, and quantity-of-received-light data of the master photoelectric switch 100 as well as of the quantity-of-received-light data and threshold data of the slave photoelectric switch 200. A red back light 24 and a green back light 25 are arranged on the LCD section 23.

In the present embodiment, the timing control section 3, the drive circuit 11, the light-emitting element 12, the light-receiving element 13, the amplifier 14, and the A/D converter 15 constitute the detecting means, and the comparing section 4 and the output section 5 constitute the comparing means. Further, the sensitivity setting control section 6 and the sensitivity setting switch 18 constitute the setting means; the control section 2 and the LCD section 23 constitute the display means; and the up switch 19, the down switch 20, and the control section 2 constitute the adjusting means. Furthermore, the control section 2 and the LCD section 23 constitute the display device for object detectors; and the up switch 19, the down switch 20, and the control section 2 constitute the setting device for object detectors. The transmitting and receiving register 10 constitutes the transmitting and receiving means. It may be noted that the quantity of light received corresponds to the detected quantity.

The slave photoelectric switch 200 shown in FIG. 2 has a processing section 1a constructed of a gate array. The processing section 1a includes a timing control section 3, a comparing section 4a, an output section 5, a sensitivity setting control section 6, a quantity-of-received-light data register 7, a threshold data register 8, and a transmitting and receiving register 10.

Similarly to the master photoelectric switch 100 shown in FIG. 1, the processing section 1a has a drive circuit 11, a light-emitting element 12, a light-receiving element 13, an amplifier 14, and an A/D converter 15 connected thereto. The quantity-of-received-light data obtained by the A/D converter 15 is stored in the register 7.

Only one threshold is set in the slave photoelectric I switch 200. The sensitivity setting control section 6 performs sensitivity setting operation in response to the operation of a sensitivity setting switch 18, and therefore automatically sets a threshold. The threshold obtained by the sensitivity setting control section 6 is stored in the register B as threshold data. The transmitting and receiving register 10 temporarily stores data to be transmitted to and received from the master photoelectric switch 100 shown in FIG. 1. The comparing section 4a compares the quantity-of-received-light data with the threshold data, and outputs the compared result to an output terminal 26 as a detected signal DET through the output section 5.

Two connectors 17A, 17B are connected to the processing section 1a. These connectors 17A, 17B serve to connect the master photoelectric switch 100 or another slave photoelectric switch. Here it is supposed that the master photoelectric switch 100 is to be connected to the connector 17A and that another slave photoelectric switch is to be connected to the connector 17B. Further, the processing section 1a also has an EEPROM 22 connected thereto. The EEPROM 22 stores the threshold data of the slave photoelectric switch 200.

Figure 3:
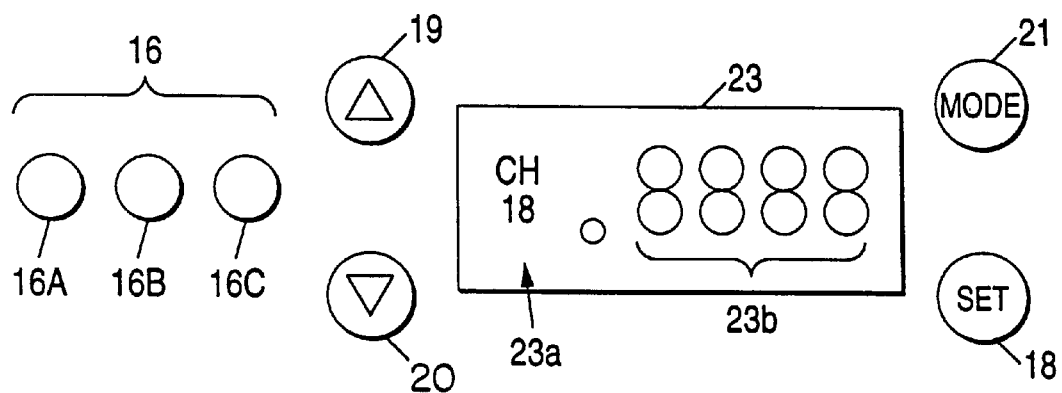
FIG. 3 is a diagram showing a display panel of the photoelectric switch master unit shown in FIG. 1.

FIG. 3 is a diagram showing a display panel of the master photoelectric switch 100.

In FIG. 3, the LED section 16 includes: an operation display LED 16A that displays a detecting condition of the channel "A"; an operation display LED 16B that displays a detecting condition of the channel "B"; a sensitivity setting display LED 16C that displays a sensitivity setting condition. The operating display LED 16A lights up red when the detected signal of the channel "A" has turned on. The operating display LED 16B lights up red when the detected signal of the channel "B" has turned on. The sensitivity setting display LED 16C lights up yellow during the sensitivity setting operation. Whether the detected signals DET1, DET2 turn on when light is injected or when light is shielded can be selected by a not shown selector switch.

When the sensitivity setting switch 18 is pressed, the threshold is automatically set by the sensitivity setting control section 6 shown in FIG. 1. The up switch 19 and the down switch 20 are employed to finely adjust the threshold set by the sensitivity setting control section 6. The LCD section 23 has a channel section 23a that displays a displayed channel and a data display section 23b that displays the quantity-of-received-light data, threshold data, or detection ratio of the displayed channel. By the "detection ratio" it is intended to mean a ratio of the quantity-of-received-light data with respect to the threshold data. That is, the detection ratio indicates a margin of the quantity of light received with respect to the threshold.

When the mode switch 21 is kept pressed for a predetermined time (e.g., three seconds) or more, the data displayed on the data display section 23b is switched between the quantity-of-received-light data and the detection ratio. Further, when the mode switch 21 is kept pressed for less than a predetermined time (e.g., three seconds), the data displayed on the data display section 23b is switched either between the quantity-of-received-light data and the threshold data or between the detection ratio and the threshold data. By operating the mode switch 21 in this way, the display mode switches over. Further, when the mode switch 21 is pressed together with the up switch 19 or with the down switch 20, the displayed channel of the channel section 23a switches over.

At the time the power switch has been turned on, the channel that was displayed when the power switch was turned off last time is displayed on the channel section 23a as the displayed channel, and the quantity-of-received-light data or the detection ratio of that channel is displayed on the data display section 23b.

The LCD section 23 gives a red display by lighting the back light 24 shown in FIG. 1 when the detected signal of the displayed channel has been turned on, and gives a green display by lighting the back light 25 shown in FIG. 1 when the detected signal of the displayed channel has been turned off.

Figure 4:
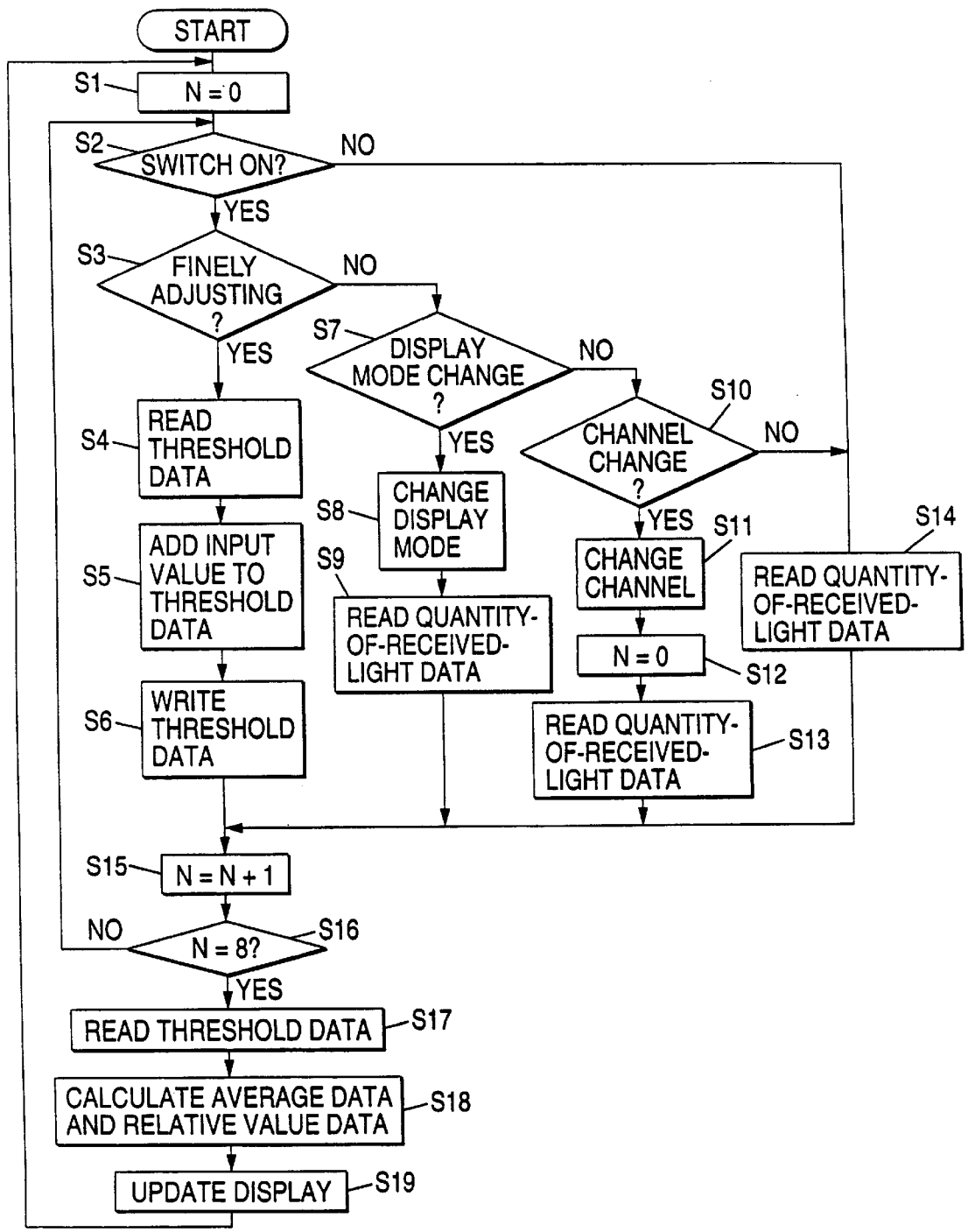
FIG. 4 is a flowchart showing a display updating operation in the master photoelectric switch shown in FIG. 1.

FIG. 4 is a flowchart showing a display updating operation in the control section 2 of the master photoelectric switch 100 shown in FIG. 1. The control section 2 updates the display of the LCD section 23 by transmitting and receiving the quantity-of-received-light data and the threshold data to and from the processing section 1.

First, the control section 2 sets the quantity-of-received-light data reading frequency N to 0 (Step S1). The control section 2 then judges whether or not the switch has been turned on (Step S2). When a command for finely adjusting the threshold is given from the up switch 19 or from the down switch 20 (Step S3), the control section 2 performs threshold data reading operation that will be described later (Step S4), and adds to the read threshold data a value inputted by the up switch 19 or the down switch 20 (Step S5). The control section 2 further performs threshold data writing operation in which the added result is written as updated threshold data, this writing operation being described later (Step S6), and thereafter goes to Step S15.

When a display mode change command is given by the mode switch 21 (Step S7), the control section 2 changes the display mode (Step S8). The control section 2 then performs the quantity-of-received-light data reading operation (Step S9), and thereafter goes to Step S15.

Further, when a channel change command is given by the mode switch 21 together with the up switch 19 or the down switch 20 (Step S10), the control section 2 changes the channel (Step S11), and resets the quantity-of-received-light data reading frequency N to 0 (Step S12). The control section 2 further performs the quantity-of-received-light data reading operation (Step S13), and thereafter goes to Step S15.

It may be noted that if there is no switch input in Step S2, the control section 2 performs the quantity-of-received-light data reading operation (Step S14), and thereafter goes to Step S15.

In Step S15, the control section 2 increments the quantity-of-received-light data reading frequency N by 1. The operations from Step S2 to Step S15 are repeated until the quantity-of-received-light data reading frequency N equals a predetermined value (e.g., 8 times). As a result, the quantity-of-received-light data reading operation is performed for a predetermined frequency (e.g., 8 times) at a predetermined cycle. Further, if the channel has been changed, the quantity-of-received-light data reading operation is performed for a predetermined frequency (e.g., 8 times) at a predetermined cycle from the change of the channel.

When the quantity-of-received-light data reading frequency N equals the predetermined frequency (e.g., 8 times) (Step S16), the control section 2 performs a threshold data reading operation that will be described later (Step S17), calculates average data by finding an average of the quantity-of-received-light data for a predetermined frequency (e.g., 8 times), and calculates a detection ratio by finding the ratio of the average data to the threshold data (Step S18). The control section 2 then updates the display of the quantity-of-received-light data, threshold data, or detection ratio of the current channel in the current display mode (Step S19).

Then, the quantity-of-received-light data reading operation, as well as the threshold data reading and writing operation will be described with reference to FIGS. 5, 6, and 7.

Figure 5:
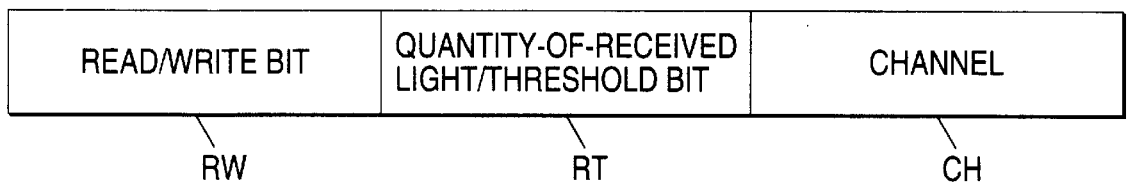
FIG. 5 is a diagram showing the format of an address used for reading and writing operations.

FIG. 5 is a diagram showing the format of an address given to the processing section 1 from the control section 2 at the time the reading operation and the writing operation are performed. As shown in FIG. 5, an address includes a read/write bit RW, a quantity-of-received-light/threshold bit RT, and a channel CH. The read/write bit RW gives an indication as to whether a reading operation is to be performed or a writing operation is to be performed. When this bit is set to "0", the reading operation is to be performed, and when this bit is set to "1", the writing operation is to be performed. The quantity-of-received-light/threshold bit RT gives an indication as to whether the data to be operated is the quantity-of-received-light data or the threshold data. When this bit is set to "0", the data to be operated is the quantity-of-received-light data, and when this bit is set to "1", the data to be operated is the threshold data. Further, the channel CH indicates the channel to be displayed or finely adjusted.

Figure 6:
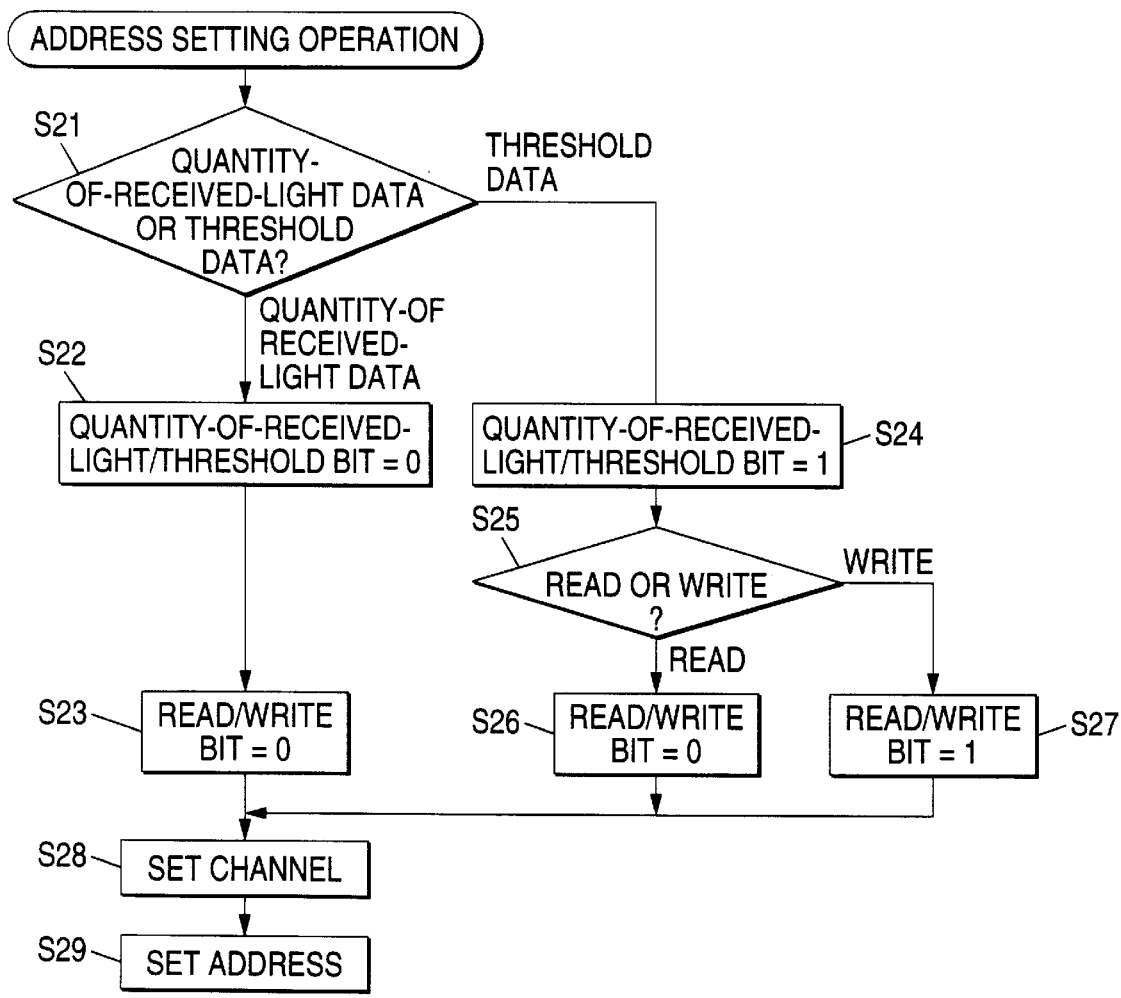
FIG. 6 is a flowchart showing an address setting operation to be performed by a control section of the master photoelectric switch shown in FIG. 1.

FIG. 6 is a flowchart showing an address setting operation by the control section 2.

First, the control section 2 judges whether the data to be operated is the quantity-of-received-light data or the threshold data (Step S21). In the case of operating the quantity-of-received-light data, the control section 2 sets the quantity-of-received-light/threshold bit RT to "0" (Step S22). Then, the control section 2 sets the read/write bit RW to "0" (Step S23).

In the case where the data to be operated is the threshold, the control section 2 sets the quantity-of-received-light/threshold bit RT to "1" (Step S24), and judges whether reading operation is to be performed or writing operation is to be performed based on whether the up switch 19 or the down switch 20 has been pressed (Step S25). If the reading operation is to be performed, the control section 2 sets the read/write bit RW to "0" (Step S26), whereas if the writing operation is to be performed, the control section 2 sets the read/write bit RW to "1" (Step S27).

The control section 2 thereafter sets the channel CH based on the channel set by the mode switch 21 together with the up switch 19 or the down switch 20 (Step S28). Then, the control section 2 sets an address including the read/write bit RW, quantity-of-received-light/threshold bit RT, and channel CH that have been set (Step S29).

Figure 7:
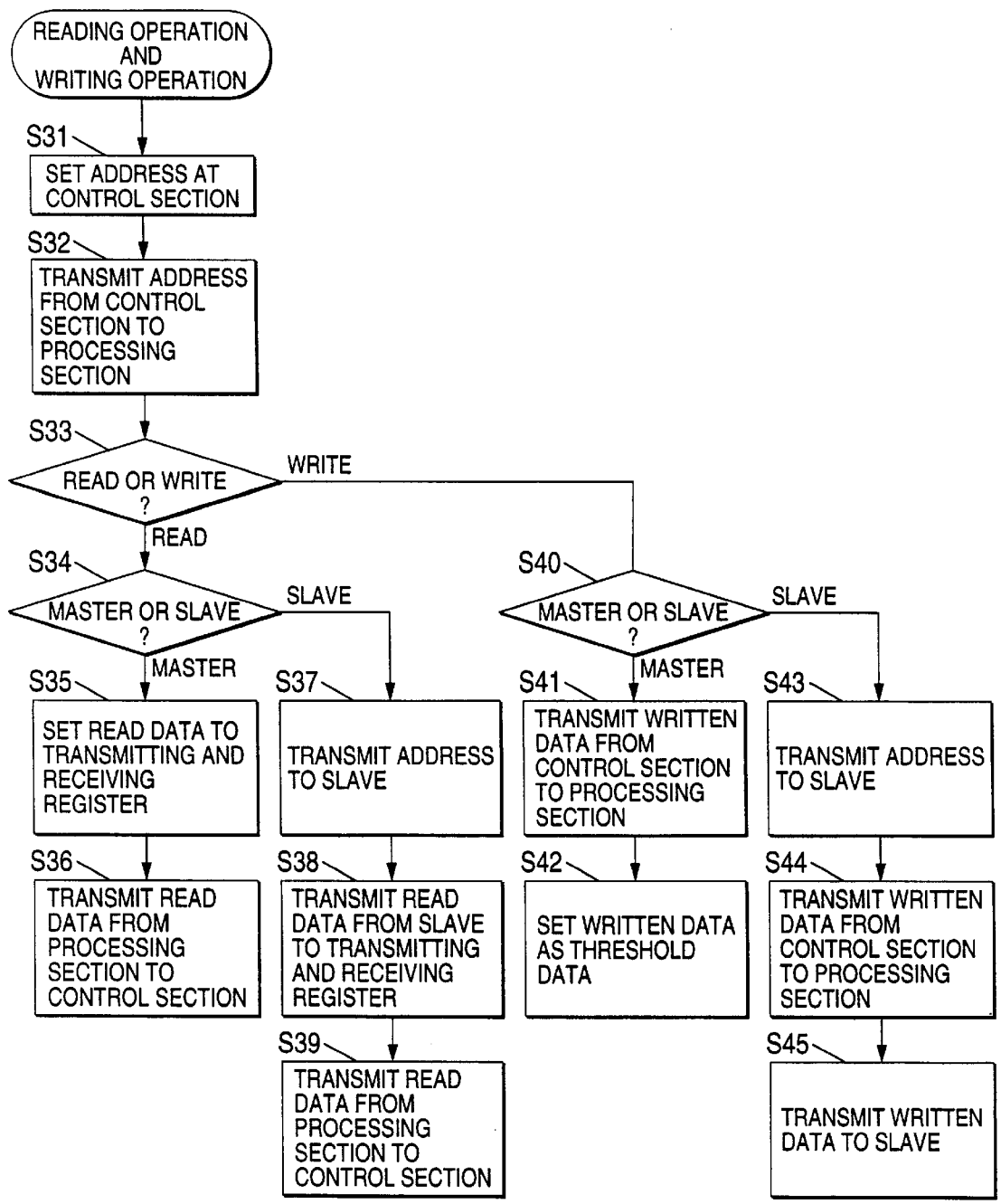
FIG. 7 is a flowchart showing a reading operation and a writing operation to be performed by the master photoelectric switch shown in FIG. 1.

FIG. 7 is a flowchart showing the reading operation and the writing operation to be performed by the processing section 1 and the control section 2.

First, the control section 2 performs the address setting operation shown in FIG. 6 (Step S31). Then, the set address is transmitted from the control section 2 to the processing section 1 (Step S32).

The processing section 1 judges whether the reading operation is to be performed or the writing operation is to be performed based on the read/write bit RW of the received address (Step S33). In the case where the reading operation is to be performed, the control section 2 judges whether the reading operation is performed upon the master photoelectric switch (itself) 100 or the reading operation is to be performed upon the slave photoelectric switch 200 based on the channel CH of the address (Step S34). That is, if the channel CH is set to "A" or "B", the reading operation is performed upon the master photoelectric switch 100, whereas the channel CH is set to a numeral that is "1" and so on, the reading operation is to be performed upon the slave photoelectric switch 200.

In the case where the reading operation is to be performed upon the master photoelectric switch (itself) 100, the processing section 1 sets the quantity-of-received-light data stored in the register 7, the first piece of threshold data stored in the register 8, or the second piece of threshold data stored in the register 9 in the transmitting and receiving register 10 as read data based on the quantity-of-received-light/threshold bit RT (Step S35). The read data in the transmitting and receiving register 10 is transmitted from the processing section 1 to the control section 2 (Step S36). The control section 2 displays the read data to the data display section 23b of the LCD section 23.

On the other hand, in the case where the reading operation is to be performed upon the slave photoelectric switch 200, the processing section 1 transmits an address to the concerned slave photoelectric switch 200 based on the channel CH of the address (Step S37). In this case, the slave photoelectric switch 200 that has received the address judges that the reading operation should be performed based on the read/write bit RW of the address, and judges whether the quantity-of-received-light data is to be operated or the threshold data is to be operated based on the quantity-of-received-light/threshold bit RT, and transmits the quantity-of-received-light data or the threshold data as the read data to the master photoelectric switch 100 through the connector 17A.

When the processing section 1 of the master photoelectric switch 100 receives the read data from the slave photoelectric switch 200 at the transmitting and receiving register 10 (Step S38), the processing section 1 transmits the read data to the control section 2 (Step S39). The control section 2 displays the received read data on the data display section 23b of the LCD section 23.

If it is determined that the writing operation is to be performed in Step S33, whether the writing operation is to be performed upon the master photoelectric switch (itself) 100 or the writing operation is to be performed upon the slave photoelectric switch 200 is judged based on the channel CH of the address (Step S40). In the case where the writing operation is to be performed upon the master photoelectric switch (itself) 100, written data is transmitted to the processing section 1 from the control section 2 (Step S41). Here, by the "written data" it is intended to mean a value obtained by adding a value inputted from the up switch 19 or the down switch 20 to the threshold data read by the last reading operation. The processing section 1 sets the received written data as new threshold data in either the register 8 or 9 in accordance with the channel CH of the address.

On the other hand, in the case where the writing operation is to be performed upon the slave photoelectric switch 200, the processing section 1 transmits an address to the appropriate slave photoelectric switch 200 based on the channel of the address (Step S43). Written data is thereafter transmitted from the control section 2 to the processing section 1 (Step S44). Here, by the "written data" it is intended to mean a value obtained by adding a value inputted from the up switch 19 or the down switch 20 to the threshold data read by the last reading operation.

The processing section 1 transmits the received written data to the slave photoelectric switch 200 through the connector 17 (Step S45). The slave photoelectric switch 200 that has received the written data judges the received written data as the new threshold data based on the read/write bit RW and quantity-of-received-light/threshold bit RT of the address and stores the written data in the register 8.

Thus, by operating the mode switch 21 together with the up switch 19 or the down switch 20 shown in FIG. 3, the channel in the channel section 23*a* is switched, and by operating the mode switch 21, the data to be displayed on the data display section 23*b* is switched among the quantity-of-received-light data, the threshold data, and the detection ratio.

As a result, the operator is informed of the quantity-of-received-light data, the first piece of threshold data and the second piece of threshold data, and the detection ratio of the master photoelectric switch 100, as well as the quantity-of-received-light data, the threshold data, and the detection ratio of the slave photoelectric switch 200 correctly.

Further, not only the threshold in the channel displayed on the channel section 23*a* is finely adjusted by operating the up switch 19 or the down switch 20, but also the new threshold data is displayed on the data display section 23*b*. Therefore, the operator can finely adjust the thresholds set to the master photoelectric switch 100 and the slave photoelectric switch while watching the indication on the data display section 23*b*.

While the case where the display device for object detectors and the setting device for object detectors of the present invention are integrally formed with the master photoelectric switch 100 has been described in the aforementioned embodiment, each of a display device for photoelectric switches and a setting device for photoelectric switches may be designed as an independent unit. Further, the display device for object detectors and the setting device for object detectors may be integrally formed with the slave photoelectric switch 200.

Further, while the case where the present invention is applied to photoelectric switches and a photoelectric switch system has been described in the aforementioned embodiment, the present invention is applicable similarly to other types of object detectors such as proximity switches, ultrasonic switches as well as to other types of object detector systems.

What is claimed is:

1. An object detector comprising:
   a detector for outputting a detected quantity based on a presence and absence of an object to be detected;
   a setting device for setting a threshold based on the detected quantity;
   a calculating device for calculating a detection ratio based on the threshold set by the setting device and the detected quantity;
   a comparator for comparing the detected quantity obtained by the detector with the threshold set by the setting device and outputting a compared result;
   a display for numerically displaying either 1) the detected quantity obtained by the detector, 2) the threshold set by the setting device or 3) the detection ratio calculated by the calculating device;
   a mode switch for switching the display between displaying 1) the detected quantity obtained by the detector, 2) the threshold set by the setting device and 3) the detection ratio calculated by the calculating device and;
   an adjuster for adjusting the threshold set by the setting device wherein the display displays the new threshold values as they are being adjusted by the adjuster.

2. The object detector according to claim 1, wherein the setting device further comprises an automatic setting device for setting, during a setting operation, a threshold based on the detected quantity of the presence or the absence of the object.

3. The object detector according to claim 1, wherein the mode switch comprises a first mode switch either for switching the display between the detected quantity obtained by the detector and the threshold set by the setting device or for switching the display between the detection ratio and the threshold set by the setting device, and a second mode switch for switching the display between the detected quantity obtained by the detector and the detection ratio.

4. The object detector according to claim 3, wherein the first mode switch switches the display between the detected quantity obtained by the detector and the threshold set by the setting device.

5. An object detector system comprising:
   a master object detector; and
   a slave object detector;
   each of the master object detector and the slave object detector comprising:
   a detector for outputting a detected quantity based on a presence and absence of an object to be detected;
   a setting device for setting a threshold based on the detected quantity;
   calculating device for calculating a detection ratio based on the threshold set by the setting device and the detected quantity; and
   a comparator for comparing the detected quantity obtained by the detector with the threshold set by the setting device and outputting a detected result;
   the master object detector further comprising a display for numerically displaying either 1) the detected quantity obtained by the detector of the master object detector, 2) the detected quantity obtained by the detector of the slave object detector, 3) the threshold set by the setting device of the master object detector, 4) the threshold set by the setting device of the slave object detector. 5) the detection ratio calculated by the calculating device of the master object detector, or 6) the detection ratio calculated by the calculating device of the slave object detector;

a mode switch for switching the display between displaying 1) the detected quantity obtained by the detector, 2) the threshold set by the setting device and 3) the detection ratio calculated by the calculating device; and an adjuster for adjusting the threshold set by the setting device wherein the display displays the new threshold values as they are being adjusted by the adjuster.

6. The object detector according to claim 5, wherein the setting device further comprises an automatic setting device for setting, during a setting operation, a threshold based on the detected quantity of the presence or the absence of the object.

7. An object detector system comprising:

a master object detector; and a slave object detector;

each of the master object detector and the slave object detector comprising:

a detector for outputting a detected quantity based on a presence and absence of an object to be detected;

a setting device for setting a threshold based on the detected quantity;

a calculating device for calculating a detection ratio based on the threshold set by the setting device and the detected quantity; and a comparator for comparing the detected quantity obtained by the detector with the threshold set by the setting device and outputting a detected result;

wherein one of the master object detector and the slave object detector further comprises:

a display for numerically displaying either 1) the detected quantity obtained by the detector, 2) the threshold set by the setting device or 3) the detection ratio calculated by the calculating device;

a mode switch for switching the display between displaying 1) the detected quantity obtained by the detector, 2) the threshold set by the setting device and 3) the detection ratio calculated by the calculating device; and an adjuster for adjusting the threshold set by the setting device wherein the display displays the new threshold values as they are being adjusted by the adjuster.

8. The object detector according to claim 7, wherein the setting device further comprises an automatic setting device for setting a threshold based on the detected quantity.

9. An object detector for detecting a presence and absence of an object, comprising:

a detector for outputting a presence quantity when the object is present and an absence quantity when the object is absent;

a setting device for setting a threshold based on the presence and absence quantity;

a calculating device for calculating a detection ratio based on the threshold set by the setting device and the presence or absence quantity;

a comparator for comparing the presence or absence quantity with the threshold set by the setting device and outputting a compared result;

a display for numerically displaying either 1) the presence or the absence quantity detected by the detector, 2) the threshold set by the setting device or 3) the detection ratio calculated by the calculating device;

a mode switch for switching the display between displaying 1) the presence or absence quantity obtained by the detector, 2) the threshold set by the setting device and 3) the detection ratio calculated by the calculating device; and an adjuster for adjusting the sold set by the setting device wherein the display displays the new threshold values as they are being adjusted by the adjuster, wherein the display includes aback light having two switchable colors, one of the two colors for indicating the presence quantity and the other of the two colors for indicating the absence quantity.

10. An object detector for detecting a presence and absence of an object, comprising:

a detector for outputting a presence quantity when the object is present and an absence quantity when the object is absent;

a setting device for setting a threshold based on the presence and absence quantity;

a calculating device for calculating a detection ratio based on the threshold set by the setting device and the presence or absence quantity;

a comparator for comparing the presence or absence quantity with the threshold set by the setting device and outputting a compared result;

a display for numerically displaying either the presence or the absence quantity obtained by the detector, the threshold set by the setting device or the detection ratio calculated by the calculating device;

a mode switch for switching the display between displaying 1) the presence or absence quantity obtained by the detector, 2) the threshold set by the setting device and 3) the detection ratio calculated by the calculating device; and an adjuster for adjusting the threshold set by the setting device wherein the display displays the new threshold values as they are being adjusted by the adjuster.

11. An object detector for detecting a presence and absence of an object at plural channels, the object detector comprising:

a plurality of detectors positioned at respective ones of the plural channels;

each of the plurality of detectors for outputting a presence quantity when the object is present and an absence quantity when the object is absent at the respective channel;

a setting device for setting, with respect to each of the detectors, a threshold based on the respective presence quantity and respective absence quantity;

a calculating device for calculating a detection ratio base on the threshold set by the setting device and the respective presence quantity and respective absence quantity;

a comparator for comparing the presence or the absence quantity detected by the respective detectors with the respective thresholds set by the setting device and outputting a compared result;

a display for numerically displaying either 1) the presence or the absence quantity obtained by a selected one of the detectors, 2) the threshold for the selected one of the detectors set by the setting device or 3) the detection ratio for the selected one of the detectors calculated by the calculating device;

a mode switch for switching the display between displaying the presence or absence quantity obtained by the detector, the threshold set by the setting device and the detection ratio set by the calculating device;

an adjuster for adjusting the threshold set by the setting device wherein the display displays the new threshold values as they are being adjusted by the adjuster.

12. The object detector according to claim 11, further comprising a channel change switch for changing the display from one of the channels to another one of the channels.

13. The object detector according to claim 12, wherein the display includes a back light having two switchable colors, one of the two colors for indicating the presence quantity and the other of the two colors for indicating the absence quantity.

14. The object detector according to claim 11, wherein the display includes a back light having two switchable colors, one of the two colors for indicating the presence quantity and the other of the two colors for indicating the absence quantity.

15. A display device for an object detector that outputs a detected quantity based on a presence and absence of an object to be detected comprising:
  a setting device for setting a threshold based on the detected quantity;
  a calculating device for calculating a detection ratio based on the threshold set by the setting device and the detected quantity;
  a display for numerically displaying either 1) the detected quantity detected by the detector, 2) the threshold set by the setting device or 3) the detection ratio calculated by the calculating device;
  a mode switch for switching the display between displaying 1) the detected quantity obtained by the detector, 2) the threshold set by the setting device and 3) the detection ratio calculated by the calculating device; and
  an adjuster for adjusting the threshold set by the setting device wherein the display displays the new threshold values as they are being adjusted by the adjuster.

16. The object detector according to claim 15, wherein the mode switch comprises a first mode switch either for switching the display between the detected quantity obtained by the detector and the threshold set by the setting device or for switching the display between the detection ratio and the threshold set by the setting device, and a second mode switch for switching the display between the detected quantity obtained by the detector and the detection ratio.

17. The object detector according to claim 16, wherein the first mode switch switches the display between displaying the detected quantity obtained by the detector and the threshold set by the setting device.

18. An object detector comprising:
  a detector for outputting an output signal corresponding to a detected quantity based on a presence and absence of an object to be detected;
  a setting device for automatically setting a threshold based on the detected quantity of the presence or absence of the object; and
  a calculating device for calculating a detection ratio based on the threshold set by the setting device and the detected quantity;
  a display for numerically displaying either 1) the detected quantity detected by the detector, 2) the threshold set by the setting device or 3) the detection ratio calculated by the calculating device; and
  a mode switch for switching the display between displaying 1) the detected quantity obtained by the detector, 2) the threshold set by the setting device and 3) the detection ratio calculated by the calculating device; and
  an adjuster for adjusting the threshold set by the setting device wherein the display displays the new threshold values as they are being adjusted by the adjuster.

19. The object detector according to claim 18, further comprising a comparator for comparing the detected quantity obtained by the detector with the threshold set by the setting device and outputting a compared result.

20. The object detector according to claim 18, wherein the mode switch comprises a first mode switch either for switching the display between the detected quantity obtained by the detector and the threshold set by the setting device or for switching the display between the detection ratio and the threshold set by the setting device, and a second mode switch for switching the display between the detected quantity obtained by the detector and the detection ratio.

21. The object detector according to claim 20, wherein the first mode switch switches the display between the detected quantity obtained by the detector and the threshold set by the setting device.

22. An object detector comprising:
  a detector for outputting a detected quantity based on a presence and absence of an object to be detected;
  a setting device for setting a threshold based on the detected quantity;
  a calculating device for calculating a detection ratio based on the threshold set by the setting device and the detected quantity;
  a comparator for comparing the detected quantity obtained by the detector with the threshold set by the setting device and outputting a compared result;
  a display for numerically displaying either 1) the detected quantity obtained by the detector, 2) the threshold set by the setting device or 3) the detection ratio calculated by the calculating device;
  a mode switch for switching the display between displaying 1) the detected quantity obtained by the detector, 2) the threshold set by the setting device and 3) the detection ratio calculated by the calculating device; and
  an adjuster for manually adjusting the threshold set by the setting device based on 1) the detected quantity, 2) the threshold, or 3) the detection ratio displayed on the display.

23. The object detector according to claim 22, further comprising:
  an adjuster for adjusting the threshold set by the setting device wherein the display displays the new threshold values as they are being adjusted by the adjuster.

24. The object detector according to claim 22, wherein the setting device further comprises an automatic setting device for setting, during a setting operation, a threshold based on the detected quantity of the presence or absence of the object.

25. An object detector for detecting a presence and absence of an object, comprising:
  a detector for outputting a presence quantity when the object is present and an absence quantity when the object is absent;
  a setting device for setting a threshold based on the presence and absence quantity;
  a calculating device for calculating a detection ratio based on the threshold set by the setting device and the presence or absence quantity;
  a comparator for comparing the presence or absence quantity with the threshold set by the setting device and outputting a compared result;
  a display for numerically displaying either the presence or the absence quantity obtained by the detector, the threshold set by the setting device or the detection ratio calculated by the calculating device;

a mode switch for switching the display between displaying 1) the presence or absence quantity obtained by the detector, 2) the threshold set by the setting device and 3) the detection ratio calculated by the calculating device; and an adjuster for manually adjusting the threshold set by the setting device based on 1) the detected quantity, 2) the threshold, or 3) the detection ratio displayed on the display.

26. A display device for an object detector that outputs a detected quantity based on a presence and absence of an object to be detected comprising:

a setting device for setting a threshold based on the detected quantity;

a calculating device for calculating a detection ratio based on the threshold set by the setting device and the detected quantity;

a display for numerically displaying either 1) the detected quantity detected by the detector, 2) the threshold set by the setting device or 3) the detection ratio calculated by the calculating device;

a mode switch for switching the display between displaying 1) the detected quantity obtained by the detector, 2) the threshold set by the setting device and 3) the detection ratio calculated by the calculating device; and an adjuster for manually adjusting the threshold set by the setting device based on 1) the detected quantity, 2) the threshold, or 3) the detection ratio displayed on the display.

27. An object detector comprising:

a detector for outputting an output signal corresponding to a detected quantity based on a presence and absence of an object to be detected;

a setting device for automatically setting a threshold based on the detected quantity of the presence or absence of the object; and a calculating device for calculating a detection ratio based on the threshold set by the setting device and the detected quantity;

a display for numerically displaying either 1) the detected quantity detected by the detector, 2) the threshold set by the setting device or 3) the detection ratio calculated by the calculating device; and a mode switch for switching the display between displaying 1) the detected quantity obtained by the detector, 2) the threshold set by the setting device and 3) the detection ratio calculated by the calculating device; and an adjuster for manually adjusting the threshold set by the setting device based on 1) the detected quantity, 2) the threshold, or 3) the detection ratio displayed on the display.

* * * * *